US 11,448,810 B2

(12) United States Patent
Torschmied et al.

(10) Patent No.: US 11,448,810 B2
(45) Date of Patent: Sep. 20, 2022

(54) DISPLAY DEVICE FOR DISPLAYING IMAGE INFORMATION CONVEYING DEPTH INFORMATION

(71) Applicant: Visteon Global Technologies, Inc., Van Buren Township, MI (US)

(72) Inventors: Axel Torschmied, Straubenhardt (DE); Giang-Nam Nguyen, Karlsruhe (DE); Ryo Kajiura, Karlsruhe (DE)

(73) Assignee: Visteon Global Technologies, Inc., Van Buren Township, MI (US)

(*) Notice: Subject to any disclaimer, the term of this patent is extended or adjusted under 35 U.S.C. 154(b) by 369 days.

(21) Appl. No.: 16/515,701

(22) Filed: Jul. 18, 2019

(65) Prior Publication Data
US 2020/0025992 A1 Jan. 23, 2020

(30) Foreign Application Priority Data
Jul. 18, 2018 (EP) .................... 18184264

(51) Int. Cl.
*G02B 5/32* (2006.01)
*G02B 27/01* (2006.01)
(Continued)

(52) U.S. Cl.
CPC ........... *G02B 5/32* (2013.01); *G02B 27/0103* (2013.01); *G02F 1/133502* (2013.01);
(Continued)

(58) Field of Classification Search
CPC .... G02B 27/00; G02B 27/01; G02B 27/0103; G02B 27/0101; G02B 27/0018;
(Continued)

(56) References Cited

U.S. PATENT DOCUMENTS 7,656,585 B1 * 2/2010 Powell ................. G02B 27/144
359/630
2004/0066547 A1 4/2004 Parker et al.
(Continued)

FOREIGN PATENT DOCUMENTS

FR 2815142 A1 4/2002
JP H10293264 A 11/1998
(Continued)

OTHER PUBLICATIONS

English translation of JP 2017144924, machine translated on Sep. 23, 2021 (Year: 2017).*
(Continued)

*Primary Examiner* — Jie Lei
(74) *Attorney, Agent, or Firm* — Quinn IP Law (57) ABSTRACT

A display device for displaying images conveying depth information comprises a first display unit for representing first image information on a first screen. The first display unit comprises the first screen with a holographic optical element, HOE, provided thereon, and a first light source for providing light for illuminating the first screen. The display device further comprises a second display unit for representing second image information. The second display unit comprises a second light source for providing light with a plurality of predetermined discrete wavelengths for creating the second image information, and a second screen which is provided in parallel or oriented at an acute angle relative to the first screen in order to project the second image information onto the first screen and thereby generate a virtual image corresponding to the second image information behind the first screen.

19 Claims, 4 Drawing Sheets

(51) Int. Cl.
H01L 27/12 (2006.01)
G02F 1/1335 (2006.01)

(52) U.S. Cl.
CPC .... G02F 1/133553 (2013.01); H01L 27/1214 (2013.01); *B60K 2370/152* (2019.05); *B60K 2370/29* (2019.05)

(58) Field of Classification Search
CPC ...... G02B 27/22; G02B 27/2271; G02B 5/32; G02B 2027/0172; G02B 2027/0118; G02B 2027/0109; G02B 2027/0112; G02F 1/1333; G02F 1/1335; G02F 1/133502; G02F 1/133553; B60K 35/00; B60K 2370/152; B60K 2370/29; B60K 2350/2017; B60K 2350/2026; B60K 2350/2056; H01L 27/12; H01L 27/1214
USPC ........... 359/13–15, 630, 631, 633, 634, 599; 345/7–9; 348/115, 118; 353/13, 28
See application file for complete search history.

(56) References Cited

U.S. PATENT DOCUMENTS

| | | |
|---|---|---|
| 2017/0052369 A1 | 2/2017 | Shimatani et al. |
| 2017/0153450 A1 | 6/2017 | Fusao |
| 2018/0157040 A1 | 6/2018 | Van Laack et al. |

FOREIGN PATENT DOCUMENTS

| | | |
|---|---|---|
| JP | 2017144924 A | 8/2017 |
| WO | 7900308 A1 | 6/1979 |
| WO | 2016081890 A1 | 5/2016 |

OTHER PUBLICATIONS

Extended European Search Report issued in EP Application No. 18184264.2 dated Jan. 30, 2019.

* cited by examiner

DISPLAY DEVICE FOR DISPLAYING IMAGE INFORMATION CONVEYING DEPTH INFORMATION

CROSS REFERENCE TO RELATED APPLICATIONS

This application claims the benefit of European Patent Application No. 18184264.2 filed on Jul. 18, 2018, entitled "DISPLAY DEVICE FOR DISPLAYING IMAGE INFORMATION CONVEYING DEPTH INFORMATION," which is incorporated by reference in its entirety in this disclosure.

TECHNICAL FIELD

One or more embodiments described herein relate to a display device. In particular, one or more embodiments related to a display device for a vehicle or aircraft, the display being configured for displaying images conveying depth information, are presented.

BACKGROUND

Current three-dimensional display devices, for example in instrument clusters for vehicles or aircraft, use prism orthogonal display technologies, which employ two separate thin-film-transistor liquid-crystal displays (TFT-LCDs) of equal size arranged at an angle of about 90 degrees to each other. A flat combiner merges the two images from the two displays to create an image conveying depth information to a user. Such a device is described for example in US 2018/157040 A1. An issue of such an arrangement is the relatively large packaging size due to the perpendicular arrangement of the two TFT-LCDs, as well as the combiner which is at about 45° to both displays.

For example, in a vehicle such as automobiles and in an aircraft there are often tight dimensional constraints for systems and components. These tight dimensional constraints may result in forgoing systems and components of relatively large packaging sizes, such as when the packaging sizes exceed the dimensional constraints. Alternatively, incorporating systems and components having relatively large packaging sizes may result in forgoing other technologies, such as when the packaging sizes equal the dimensional constraints; thus preventing other systems and components from being incorporated due to a lack of space. As one example, in a vehicle, these issues appear in the space between a dashboard and a firewall.

Figure 5:
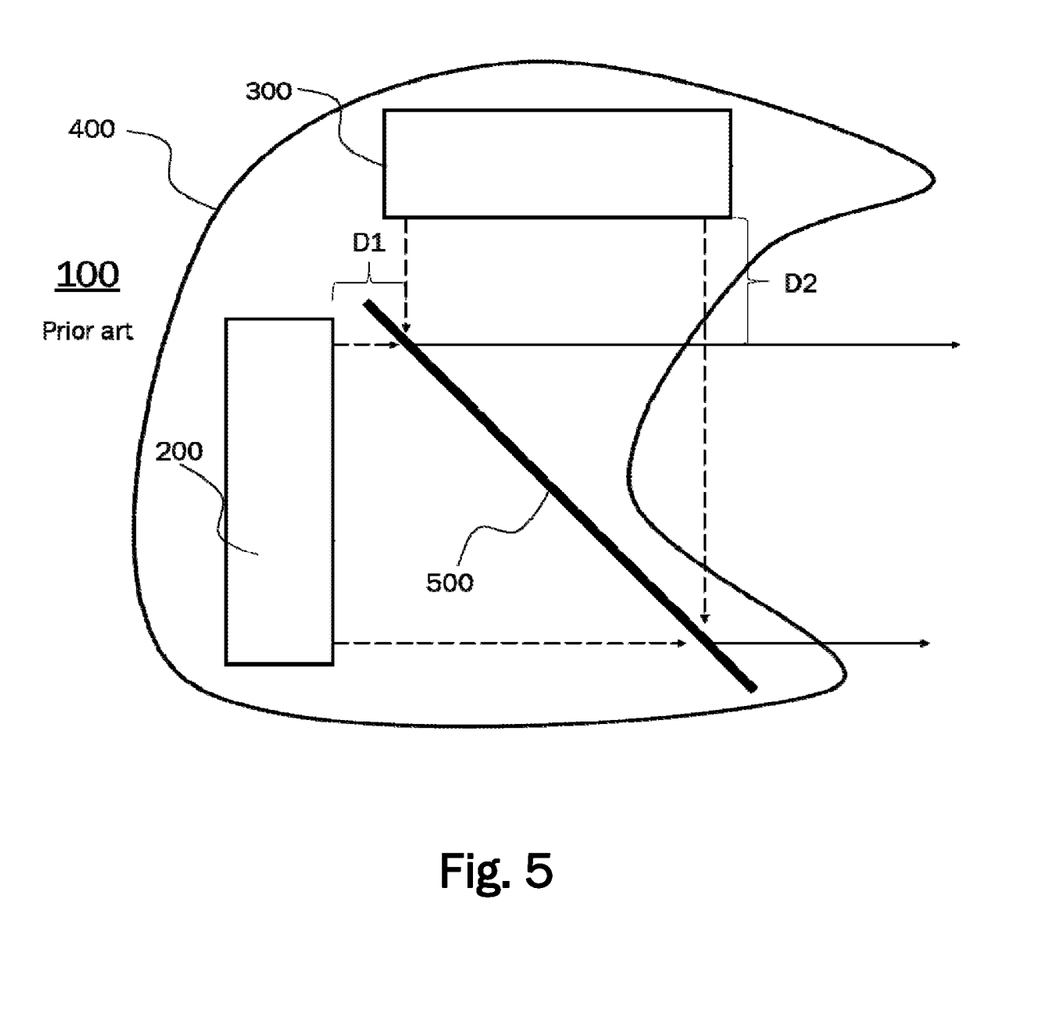
FIG. 5 illustrates a conventional display device according to the prior art.

A conventional display device 100 with two TFT-LCDs, like the one mentioned above, is schematically illustrated in FIG. 5 as a cross-sectional view from a side of the display device 100. The display device 100 comprises a first TFT-LCD 200 arranged on the left behind a flat combiner 500 at a first distance D1 and a second TFT-LCD 300 arranged on top of the combiner 500 at a second distance D2. Two displays 200, 300 which may have different sizes are arranged at an angle of 90 degrees to each other. The flat combiner 500 is made of glass and is arranged between the two TFT-LCDs 200, 300 at an angle of 45 degrees. An anti-reflection coating is provided on a first surface of the combiner 500 facing the first TFT-LCD 200, and a reflective coating is provided on a second surface of the combiner 500 facing the second TFT-LCD 300. By reflecting light from the second TFT-LCD 300 and transmitting light from the first TFT-LCD 200 as indicated by the arrows, the images of the two displays 200, 300 are combined into a single image conveying depth information. The difference in distances D2–D1 characterizes the depth of information which can be conveyed by the display device 100. However, only two image planes corresponding to the two displays 200, 300 can be provided and a relatively large and bulky case 400 surrounds the two displays 200, 300 and the combiner 400.

SUMMARY

One or more embodiments describe an improved display device for displaying images conveying depth information is provided.

The display device comprises a first display unit for representing first image information on a first screen. The first display unit comprises the first screen which is provided with a holographic optical element (HOE) thereon. A HOE is an optical element such as for example a lens, filter, beam splitter, diffraction grating or mirror that is produced using holographic imaging processes or principles.

The first display device further comprises a first light source for providing light for illuminating the first screen. Preferably, the first light source serves as a backlight of the first screen. A preferred first light source emits light across a broad spectrum of the visible range, such as white light.

The display device further comprises a second display unit for representing second image information. The second display unit comprises a second light source for providing light with a plurality of predetermined discrete wavelengths for creating the second image information. The second display unit further comprises a second screen oriented at an acute angle relative to the first screen in order to project the second image information onto the first screen and thereby generate a virtual image corresponding to the second image information behind the first screen.

The HOE is reflective for the plurality of predetermined discrete wavelengths and transmissive for other wavelengths of the visible spectrum, such that the first image information and the second image information are combined in order to convey depth information. Preferably, the HOE is transmissive for the entire visible spectrum except for the plurality of predetermined discrete wavelengths.

The display device described herein is thus able to generate images with depth information, wherein a plurality of image planes can be realized by combining the first image information of the first display unit with the second image information of the second display unit. One of the image planes corresponds to the first screen. The other image planes are virtual image planes appearing behind the first screen. The HOE serves to align the second image information projected onto the first display with the first image information in order to combine the first and second image information into a combined image conveying depth information.

According to an aspect, the HOE is a volume HOE which is preferably recorded in a transparent photopolymer film. A volume HOE is a HOE with a thickness of the recording material being larger than the light wavelength used for recording. For example, visible light has a wavelength between about 390 nm and 700 nm. A typical thickness of a volume HOE lies between about 5 μm and 50 μm. A larger thickness can increase the amount of light reflected by the HOE while decreasing the amount of transmitted light. At a preferred thickness of about 10 μm a good tradeoff between transmission and reflection of light can be achieved. Preferably, a photopolymer is foreseen as the material for the HOE. The holographic structure that is inserted into the HOE can be introduced, for example, by means of a laser.

According to an aspect, a hologram for all of the plurality of predetermined discrete wavelengths is recorded into a single HOE. Alternatively, separate HOEs can be recorded for each of the plurality of predetermined discrete wavelengths. Since the HOE is recorded into a thin film, a plurality of separate holograms can be laminated on top of each other.

According to an aspect, the HOE is laminated into or on top of the first screen of the first display unit. For example, the HOE can be affixed on one surface of the first screen or optically bonded to it. Alternatively, the HOE can be laminated into the first screen.

According to a further aspect, the first display unit is a thin-film-transistor liquid-crystal display (TFT-LCD). An advantage of using a TFT-LCD is that these displays can provide high-resolution images. Furthermore, a TFT-LCD can have very good addressability and contrast. In particular, high addressability is important for synchronizing the first image information displayed on the first screen with the second image information provided in the virtual images behind the first screen.

According to an aspect, the first light source comprises light-emitting diodes (LEDs) or organic light-emitting diodes (OLEDs). In particular, white light backlighting provided by LEDs or OLEDs can give very good optical contrast and homogenous illumination of the first display.

According to an aspect, the second light source is a laser light source, preferably comprising laser diodes, for example vertical-cavity surface-emitting lasers (VCSELs). A laser can provide light with a very narrow-bandwidth of only a few nanometers.

According to yet another aspect, the plurality of predetermined discrete wavelengths may comprise at least red, green, and blue light. By combining red, green, and blue light (RGB-color scheme), a broad array of colors can be produced by superimposing a predetermined intensity of each of the three colors.

According to an aspect, the second screen is a diffuser. In particular, a holographic diffuser may be used as the diffuser. A diffuser can be used to concentrate laser light within an angle determined by the field of view, and to reduce laser speckle. On the diffuser, a real image of the second image information may be generated. This real image is then projected onto the first display unit, thereby generating the virtual image behind the first screen.

According to an aspect, the display device further comprises a control unit for synchronizing the first and second image information. By synchronizing the first and second image information, three-dimensional color images can be generated. The display device can thus present image information at different image planes, thus conveying depth information. It is thus possible to generate three-dimensional images without the need for glasses to be worn by the user.

According to an aspect, at least two virtual images are generated at different virtual image planes behind the first screen. This way, information can be presented to the user in at least three different image planes. A first image plane is that of the first (real) image information on the first screen. Two more image planes are the at least two virtual image planes behind the first screen. For example, information with different levels of priority can be displayed on different image planes. Furthermore, depth information can be conveyed in order to more realistically present three-dimensional information. For example, in an instrument cluster for a vehicle or aircraft, situational awareness of the driver or pilot can be improved by presenting information related to the environment of the vehicle or aircraft in different image planes.

According to an aspect, each of the at least two virtual images is generated using at least three predetermined discrete wavelengths, comprising red, green, and blue light. Thus, each of the virtual images generated at different image planes can be generated in full color using the RGB color scheme.

According to a further aspect, a first virtual image is generated using a first wavelength of the plurality of predetermined discrete wavelengths and a second virtual image is generated using a second wavelength of the plurality of predetermined discrete wavelengths different from the first wavelength. In other words, each predetermined discrete wavelength may be associated with a virtual image plane. For example, a first virtual image appearing further distant may be generated using a green laser light source and a second virtual image appearing closer to the user can be generated using a red laser light source. Thereby it is possible to divert more attention of the user to a warning presented in red which also appears closer to the user than the first virtual image.

According to an aspect, the HOE has a flat (planar) mirror element recorded therein. When a flat mirror is recorded in the HOE, the apparent distance of the generated virtual image from the HOE corresponds to the distance of the object, i.e. of the real image generated on the second screen.

According to yet another aspect, the HOE has a curved mirror element recorded therein. The curved mirror element may be a convex or a concave mirror. A curved mirror changes the apparent distance of the virtual image since it either focusses or defocusses the light coming from the second screen. The at least two virtual images can be generated by recording at least two mirror functions into at least two HOEs with different sets of RGB laser wavelengths; or into a single HOE in spatial domain, i.e. the central area of the HOE has one mirror function and the outer area has another mirror function. In particular when using separate holograms for different wavelengths, different curvatures can be used for the recorded HOEs, such that the virtual images may appear at different distances depending on the wavelength. The second light source may use the multiple different sets of RGB laser wavelengths to generate different image planes in full color using the RGB color scheme. In another case, the second light source may use one set of RGB laser wavelengths, and the image planes may be single color images (for example the first, further distant virtual image is green, and the second, closer virtual image is red).

According to yet another aspect, an instrument cluster apparatus for a vehicle or an aircraft is provided comprising at least one display device according to one or more embodiments.

The above features and advantages and other features and advantages of the present teachings are readily apparent from the following detailed description of the best modes for carrying out the teachings when taken in connection with the accompanying drawings.

BRIEF DESCRIPTION OF THE DRAWINGS

Further details, features and advantages of embodiments of the disclosure are apparent from the following description of embodiments with reference to the associated drawings. The figures show the following.

The present disclosure may have various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure as encompassed by the appended claims.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure. Furthermore, the drawings are in simplified form and are not to precise scale.

For purposes of convenience and clarity only, directional terms such as inner, outer, top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein. Furthermore, the teachings may be described herein in terms of functional and/or logical block components and/or various processing steps. It should be realized that such block components may be comprised of any number of hardware, software, and/or firmware components configured to perform the specified functions.

Figure 1:
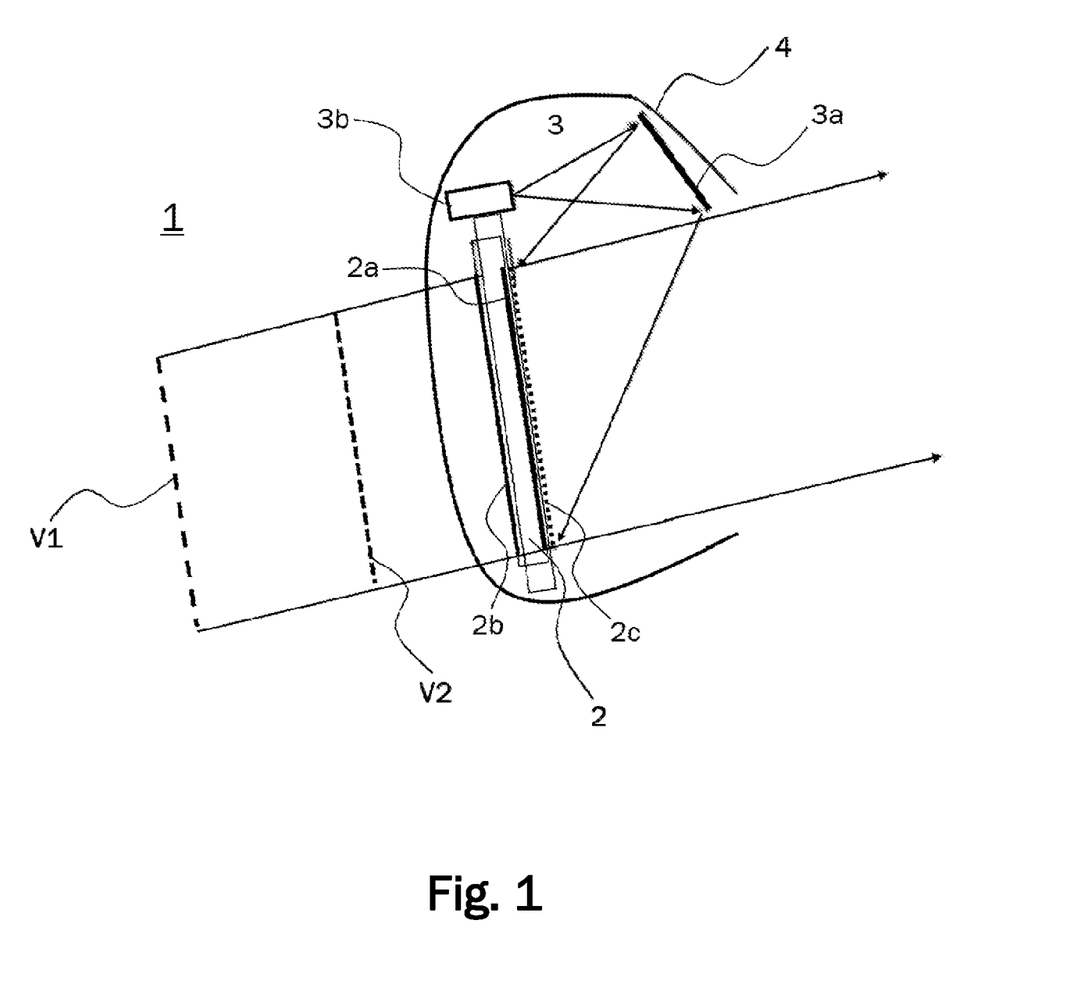
FIG. 1 schematically illustrates an exemplary embodiment of a display device.

FIG. 1 schematically illustrates an exemplary embodiment of a display device 1 for displaying images conveying depth information to a user. Such a display device 1 may be used for example in an instrument cluster apparatus for a vehicle or an aircraft. FIG. 1 is a cross-sectional side view of the display device 1.

The display device 1 of FIG. 1 comprises a first display unit 2 which may be a thin-film-transistor liquid-crystal display (TFT-LCD) with a first screen 2a onto which a reflective volume holographic optical element (HOE) 2c is laminated. Alternatively, the HOE 2c can be provided inside the first screen 2a. The TFT-LCD 2 comprises a first light source 2b which comprises light-emitting diodes (LEDs) or organic light-emitting diodes (OLEDs) emitting white light for illuminating the first screen 2a as backlight. On the first screen 2a, first image information can be displayed as a real image. White light backlighting using LEDs or OLEDs can provide a very good optical contrast and a homogenous illumination of the first display 1a.

An advantage of using a TFT-LCD for the first display unit 2 is that a TFT-LCD can provide high quality images with a high resolution. Furthermore, a TFT-LCD can have very good addressability and contrast. In particular, high addressability is important for synchronizing the first image information displayed on the first screen 2a with the second image information provided in the virtual images behind the first screen 2a.

The display device 1 further comprises a second display unit 3 comprising a second light source 3b and a second screen 3a. On the second screen 3a, second image information is represented as a real image. The second screen 3a is oriented in parallel or at an acute angle relative to the first screen 2a in order to project the second image information towards the HOE 2c and thereby generate at least one virtual image V1, V2 behind the first screen 2a, corresponding to the second image information and depending on the optical functions that were recorded in the HOE.

The second light source 3b provides light with a plurality of predetermined discrete wavelengths for creating the second image information. For example, the second light source 3b may be a laser system providing at least one red laser beam, one green laser beam, and one blue laser beam. The second light source 3b can thus be an RGB laser system.

In the present embodiment, the second screen 3a may be a diffuser. A diffuser is used in order to concentrate the laser light of the second image within an angle determined by the Field Of View, and to reduce the laser speckle. On the diffuser 3a, a real image of the second image information may be generated. This real image is then projected onto the HOE 2c, thereby generating the virtual image V1, V2 behind the first screen 2a.

In FIG. 1, two virtual images V1, V2 are represented by dashed lines with different distances behind the first screen 2a. The arrows pointing towards the right indicate the direction in which the combined image information comprising the first and second image information is provided to the user.

Each of the two virtual images V1, V2 can be generated using at least three predetermined discrete wavelengths, comprising red, green, and blue light. Thus, each of the virtual images V1, V2 generated at different image planes can be generated in full color using the RGB color scheme.

Alternatively, the first virtual image V1 may be generated using a first wavelength and the second virtual image V2 may be generated using a second wavelength. In other words, each predetermined discrete wavelength may be associated with a virtual image plane. For example, the first virtual image V1 appearing further away with a larger distance to the first screen 2a may be generated using a green laser beam and the second virtual image V2 appearing closer to the first screen 2a (and therefore also closer to the user) can be generated using a red laser beam. Thereby it is possible to divert more attention of the user to a warning, presented in red as the second virtual image V2 which appears closer to the user than the first virtual image V1.

The HOE 2c is a reflective volume HOE acting as a mirror for the plurality of predetermined discrete wavelengths emitted by the second light source 3b and transmissive for all other wavelengths of the visible spectrum, such that the first image information and the second image information are combined in order to convey depth information.

The HOE 2c laminated to the first screen 2a reflects the light from the second display unit 3 toward the user at an angle such that the first display information and the second display information spatially overlap in order to create an image conveying depth information. In particular, the first and second image information is displayed in a synchronized manner such that the virtual images generated by the second display unit 3 add depth information to the first image information created by the first display unit 2.

The resulting three-dimensional image therefore differs from conventional stereoscopic images which rely on providing separate images to the left and right eye of an observer. In the present display device 1, the depth information is created by the fact that the virtual images appear behind the first screen 2a. When the displayed content corresponding to the first and second image information is synchronized, depth information can be added by the distance between the virtual and the real image.

In principle, the first display unit 2 may be a TFT-LCD with a HOE 2c laminated on top of the first screen 2a, such that the first image information represented on the first screen 2a can be seen through the HOE 2c by a user as usual. The HOE 2c is illuminated by the second light source 3b using narrow-band light conveying second image information which is reflected by the HOE 2c. The second image information generates a virtual image behind the first display unit 2, thus conveying depth information to the user.

The first display unit 2 and the second display unit 3 are arranged inside a cover 4. As becomes apparent when comparing FIG. 1 with the conventional display device 100 illustrated in FIG. 5, the display device 1 according to the present embodiment provides a significantly reduced package size. Furthermore, the depth information can be much greater, since it does not depend on a difference in distance to a centrally arranged combiner but rather depends on the optical properties of the optical elements recorded in the HOE 2c. Moreover, the HOE 2c, which acts as a combiner in this case, can be laminated on top of a flat or curved display, for example by using a Liquid Optically Clear Adhesive process, allowing for easier packaging than the centrally arranged glass combiner according to the prior art.

The display device 1 further comprises a control unit (not depicted) for synchronizing the first and second image information. By synchronizing the first and second image information, three-dimensional color images can be generated. The display device 1 can thus present image information at different image planes or three-dimensional color images without the need for the user to wear special glasses.

Figure 2:
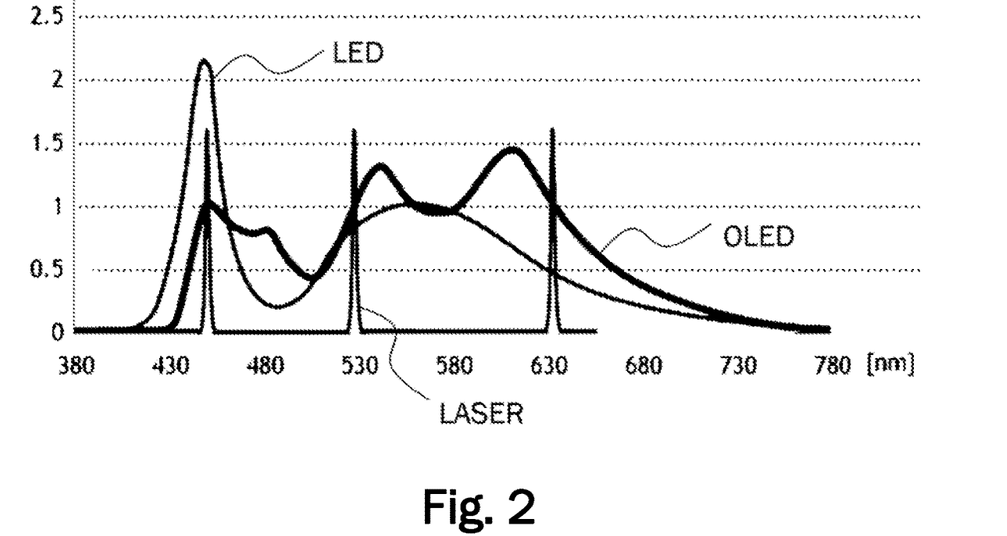
FIG. 2 schematically illustrates the emission spectra of a light-emitting diode (LED) or an organic light-emitting diode (OLED), each emitting white light, and a laser source emitting three discrete wavelengths.

As described above, the first light source 2b may comprise LEDs or OLEDs for providing a homogeneous white backlight for illuminating the first screen 2a. Exemplary spectra of white light LEDs and white light OLEDs are illustrated in FIG. 2. For comparison, the line spectra of a blue laser with a wavelength of about 450 nm, of a green laser with a wavelength of about 530 nm, and a red laser with a wavelength of about 630 nm are illustrated in FIG. 2. The three laser lines shown in FIG. 2 can be that of an RGB laser used for a second light source 3b in a second display unit 3.

Figure 3:
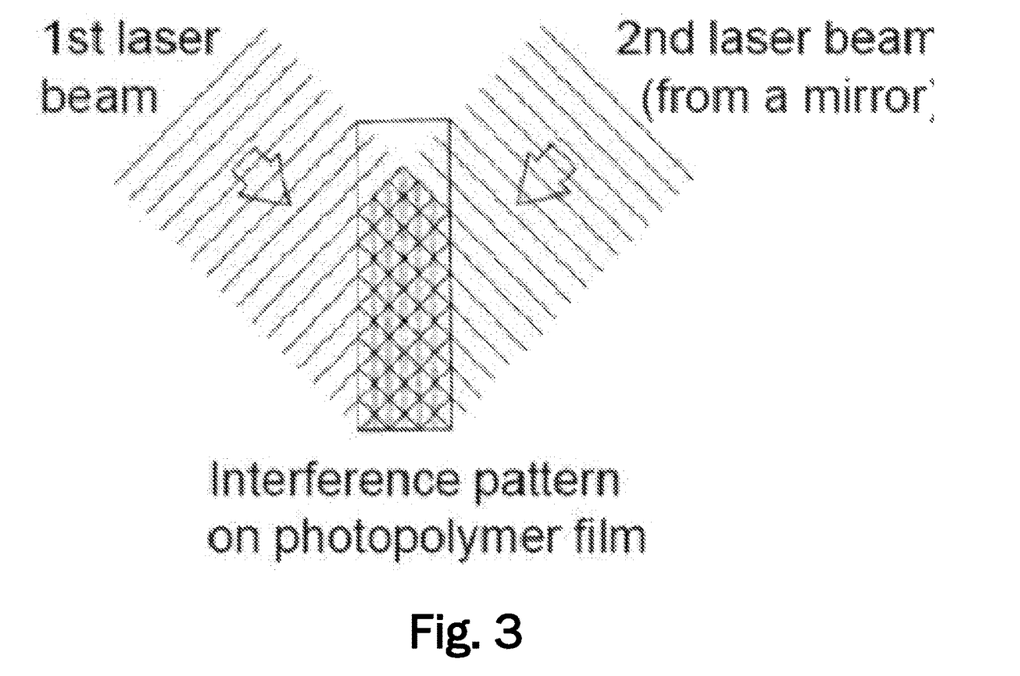
FIG. 3 schematically illustrates a process for recording a holographic optical element.

FIG. 3 illustrates a process for recording a reflective volume holographic optical element (HOE) by means of interference from a first laser beam and a second laser beam. This process corresponds to methods of creating a hologram using interference between a reference beam and an object beam. Here, the first laser beam is the reference beam and the second laser beam is the object beam, wherein the object is a mirror. If the mirror is a flat mirror, a flat mirror is recorded as the optical element in the hologram. If the mirror reflecting the second beam is a curved mirror, a curved mirror is recorded as the optical element in the hologram. For a flat mirror, the virtual image distance is equal to the distance of the object reflected by the mirror. For a curved mirror, the virtual image distance can be further than the object distance. By means of the process illustrated in FIG. 3, an optical element such as a flat mirror or a curved mirror can be recorded in a thin photopolymer film with a thickness of about 5 to 50 µm.

According to an aspect, the HOE is a volume HOE which is preferably recorded in a transparent photopolymer film. A volume HOE is a HOE with a thickness of the recording material much higher than the light wavelength used for recording. For example, visible light has a wavelength between about 390 nm and 700 nm. A typical thickness of a volume HOE lies between about 5 µm and 50 µm. A larger thickness can increase the amount of light reflected by the HOE while decreasing the amount of transmitted light. At a preferred thickness of about 10 to 20 µm a good tradeoff between transmission and reflection of light can be achieved. Preferably, a photopolymer is foreseen as the material for the HOE. The holographic structure that is inserted into the HOE can be introduced, for example, by means of a laser.

By means of the illustrated process a hologram for all of the plurality of predetermined discrete wavelengths of the second light source 3b can be recorded into a single HOE. Alternatively, separate HOEs can be recorded for each of the plurality of predetermined discrete wavelengths. Since the HOE is recorded into a thin film, a plurality of separate holograms can be laminated on top of each other onto the first screen 2a.

For example, the HOE can have a flat (planar) mirror element recorded therein. When a flat mirror is recorded in the HOE, the apparent distance of the generated virtual image from the HOE 2c corresponds to the distance of the object, i.e. of the real image generated on the second screen 3a, from the HOE 2c.

Alternatively, the HOE 2c can have a curved mirror element recorded therein. A curved mirror changes the apparent distance of the virtual image since it either focusses or defocusses the light coming from the second screen. In particular when using separate holograms for different wavelengths, different curvatures can be used for the recorded HOEs, such that the virtual images may appear at different distances depending on the wavelength as illustrated in FIG. 1.

Figure 4:
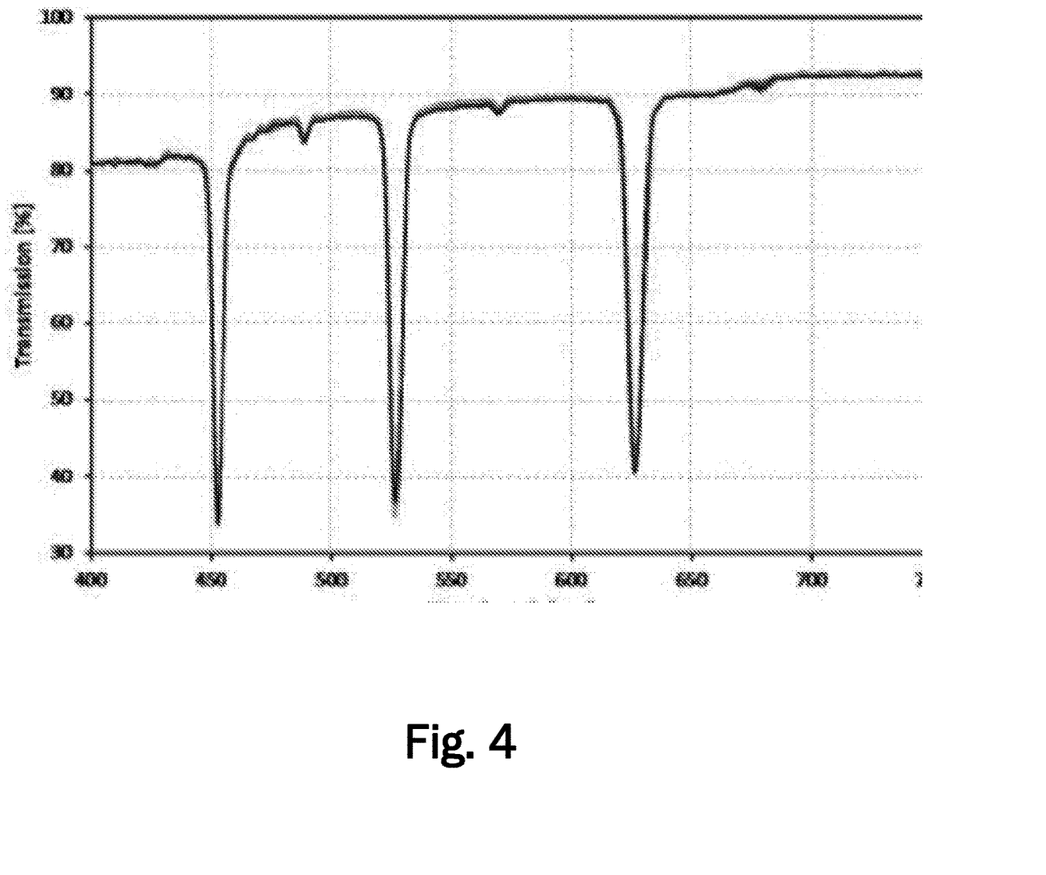
FIG. 4 illustrates the transmission of light through an exemplary holographic optical element.

FIG. 4 illustrates the transmission of light through an exemplary holographic optical element (HOE). As can be seen FIG. 4, the exemplary HOE transmits at least about 80% of incident light across a broad frequency spectrum in the visible range and reflects at least about 60% of the laser wavelengths. Narrow-band peaks are visible at about 450 nm, 530 nm, and 630 nm, corresponding to the three laser lines illustrated in the spectrum of FIG. 2. In other words, the HOE is configured to reflect light of three predetermined discrete wavelengths in the blue, green, and red spectral range, and to transmit light across the entire visible range except for the three discrete wavelengths.

The features described in the above description, claims and figures can be relevant to the disclosure in any combination. Their reference numerals in the claims have merely been introduced to facilitate reading of the claims. They are by no means meant to be limiting.

Throughout this specification various indications have been given as to embodiments of the disclosure. However, it should be understood that the disclosure is not limited to any one of these. It is therefore intended that the foregoing detailed description be regarded as illustrative rather than limiting. It is, thus, understood that various changes may be made without departing from the spirit and scope of the disclosure. Additionally, the features of various implementing embodiments may be combined to form further embodiments of the disclosure.

REFERENCE NUMERALS 1 display device
2 first display unit (TFT-LCD)
2a first screen
2b first light source (LED or OLED)
2c holographic optical element (HOE)
3 second display unit
3a second screen (diffuser)
3b second light source (RGB laser)
4 case
V1 first virtual image
V2 second virtual image

The invention claimed is:

1. A display device for displaying images conveying depth information comprising:
 a first display unit for representing first image information, the first display unit comprising:
  a first screen comprising a holographic optical element (HOE) provided thereon; and
  a first light source for illuminating the first screen and representing the first image information;
 a second display unit for representing second image information, the second display unit comprising:
  a second light source for providing light with a plurality of predetermined discrete wavelengths for creating the second image information; and
  a second screen oriented at an angle relative to the first screen in order to project the second image information onto the first screen and thereby generate a virtual image corresponding to the second image information behind the first screen; and
 a control unit for synchronizing the first image information and the second image information,
 wherein the HOE is reflective for the plurality of predetermined discrete wavelengths and transmissive for other wavelengths of the visible spectrum, such that the first image information and the second image information are combined by the control unit in order to convey depth information, and
 wherein the first image information and the second image information is displayed in a synchronized manner such that the virtual image corresponding to the second image information generated by the second display unit behind the first screen adds depth information to the first image information represented on the first screen of the first display unit.

2. The display device according to claim 1, wherein the HOE is a volume HOE recorded in a transparent photopolymer film.

3. The display device according to claim 1 wherein the HOE is laminated on or into the first screen of the first display unit.

4. The display device according to claim 1, wherein the first display unit is a thin-film-transistor liquid-crystal display (TFT-LCD).

5. The display device according to claim 1, wherein the first light source comprises at least one of light-emitting diodes (LED) or organic light-emitting diodes (OLED).

6. The display device according to claim 1, wherein the second light source is a laser light source.

7. The display device according to claim 1, wherein the plurality of predetermined discrete wavelengths at least comprises red, green, and blue light.

8. The display device according to claim 1, wherein the second screen is a diffuser.

9. The display device according to claim 1, wherein at least one virtual image is generated at different virtual image planes behind the first screen.

10. The display device according to claim 9, wherein the at least one virtual image includes multiple virtual images, wherein each of the multiple virtual images is generated using at least three predetermined discrete wavelengths, comprising red, green, and blue light.

11. The display device according to claim 9, wherein the at least one virtual image includes a first virtual image generated using a first wavelength of the plurality of predetermined discrete wavelengths and a second virtual image generated using a second wavelength of the plurality of predetermined discrete wavelengths different from the first wavelength.

12. The display device according to claim 1, wherein the HOE has a flat mirror element recorded therein.

13. The display device according to claim 1, wherein the HOE has a curved mirror element recorded therein.

14. An instrument cluster for a vehicle comprising:
 at least one display device for displaying images conveying depth information, wherein the at least one display device includes:
  a first display unit for representing first image information, the first display unit having:
   a holographic optical element (HOE) provided on the first screen, and
   a first light source for providing light for illuminating the first screen that represents the first image information;
  a second display unit for representing second image information, the second display unit having:
   a second light source for providing light with a plurality of predetermined discrete wavelengths for creating the second image information, and
   a second screen oriented at an angle relative to the first screen in order to project the second image information onto the first screen
  and thereby generate a virtual image corresponding to the second image information behind the first screen; and
 a control unit for synchronizing the first image information and the second image information,
 wherein the HOE is reflective for the plurality of predetermined discrete wavelengths and transmissive for other wavelengths of the visible spectrum, such that the first image information and the second image information are combined by the control unit in order to convey depth information, and
 wherein the first image information and the second image information is displayed in a synchronized manner such that the virtual image corresponding to the second image information generated by the second display unit behind the first screen adds depth information to the first image information represented on the first screen of the first display unit.

15. The instrument cluster of claim 14, wherein the HOE of the first display unit of the display device is laminated on or into the first screen of the first display unit.

16. The instrument cluster of claim 14, wherein the first display unit of the display device is a thin-film-transistor liquid-crystal display (TFT-LCD).

17. The instrument cluster of claim 14, wherein the first light source of the first display unit of the display device comprises at least one of light-emitting diodes (LED) or organic light-emitting diodes (OLED).

18. The instrument cluster of claim 14, wherein the second light source of the second display unit of the display device is a laser light source.

19. The instrument cluster of claim 14, wherein the second screen of the second display unit of the display device is a diffuser.

* * * * *